(12) United States Patent
Chen (10) Patent No.: US 10,916,311 B2
(45) Date of Patent: Feb. 9, 2021

(54) FLASH MEMORY AND OPERATION METHOD THEREOF

(71) Applicant: GigaDevice Semiconductor (Beijing) Inc., Beijing (CN)

(72) Inventor: Minyi Chen, Beijing (CN)

(73) Assignee: GigaDevice Semiconductor (Beijing) Inc., Beijing (CN)

( * ) Notice: Subject to any disclaimer, the term of this patent is extended or adjusted under 35 U.S.C. 154(b) by 36 days.

(21) Appl. No.: 16/279,046

(22) Filed: Feb. 19, 2019

(65) Prior Publication Data

US 2020/0211653 A1    Jul. 2, 2020

(30) Foreign Application Priority Data

Dec. 30, 2018  (CN) .......................... 2018 1 1644296

(51) Int. Cl.
| | |
|---|---|
| *G11C 29/00* | (2006.01) |
| *G11C 16/26* | (2006.01) |
| *G11C 16/04* | (2006.01) |
| *G11C 16/08* | (2006.01) |
| *G11C 29/52* | (2006.01) |
| *G06F 11/10* | (2006.01) |
| *G11C 11/56* | (2006.01) |

(52) U.S. Cl.
CPC .......... *G11C 16/26* (2013.01); *G06F 11/1068* (2013.01); *G11C 16/0483* (2013.01); *G11C 16/08* (2013.01); *G11C 29/52* (2013.01); *G11C 11/5642* (2013.01); *G11C 11/5671* (2013.01)

(58) Field of Classification Search
CPC ..... G11C 16/26; G11C 16/0483; G11C 16/08; G11C 29/52; G11C 11/5642; G11C 11/5671; G06F 11/1068
USPC ........ 714/764, 718, 721, 733, 740; 324/763, 324/765, 522, 523; 365/185.09, 189.09, 365/200, 201, 204, 210.12, 220, 221
See application file for complete search history.

(56) References Cited

U.S. PATENT DOCUMENTS

| | | | |
|---|---|---|---|
| 9,659,664 B1* | 5/2017 | Griffin | .................... G11C 16/26 |
| 2009/0210776 A1* | 8/2009 | Cho | .................... G06F 11/1072 |
| | | | 714/805 |
| 2016/0062827 A1* | 3/2016 | Yamauchi | .......... G11C 16/3459 |
| | | | 714/764 |
| 2019/0355429 A1* | 11/2019 | Chen | .................... G11C 11/5628 |

* cited by examiner

*Primary Examiner* — Christine T. Tu
(74) *Attorney, Agent, or Firm* — Norton Rose Fulbright US LLP; James R. Crawford (57) ABSTRACT

Provided are a flash memory and an operation method thereof. The flash memory includes a memory cell array, a controller and a register. The register stores read parameters that include a read voltage value and a read pass voltage value. The controller is configured to perform the read operation on a selected page according to the read parameters to read out the raw data stored in the selected page, determine whether the raw data includes an error bit, and in response to determining that the raw data includes the error bit, update the read parameters by decreasing the read voltage value and/or increasing the read pass voltage value.

16 Claims, 6 Drawing Sheets

FLASH MEMORY AND OPERATION METHOD THEREOF

CROSS-REFERENCE TO RELATED APPLICATIONS

This application claims priority to a Chinese patent application No. 201811644296.5, filed on Dec. 30, 2018, the disclosure of which is incorporated herein by reference in its entirety.

TECHNICAL FIELD

Embodiments of the present disclosure relate generally to semiconductor memory devices. More particularly, embodiments of the present disclosure relate to a flash memory and a method for operating the flash memory.

BACKGROUND

Nonvolatile memory device is widely used for data storage applications, and becomes an indispensable component of modern electronic systems. Data stored in the nonvolatile memory is not lost when the power supply is switched off. Examples of non-volatile memory include read-only memory, flash memory, ferroelectric RAM, etc. Flash memory is developed from electrically erasable programmable read-only memory (EEPROM) in the early 1980s. Flash memory can be divided into NOR flash memory and NAND flash memory depending on how the memory cells are organized. NAND flash memory has excellent characteristics for integration and low cost, and thus has been widely used in high density data storage, such as solid state disk and mobile phones. NOR flash memory has typically been used for code storage. NOR flash provides full address and allows random access to any memory location, and accordingly used for storing program code that rarely needs to be updated, such as a computer's BIOS.

Error Correction Code (ECC) has been used for detecting and correcting bit errors. The ECC circuit encodes source data in such a way that a decoder can identify and correct errors in the source data. Typically, the ECC circuit encodes the source data by generating a number of redundant bits (also referred to as ECC data) and adding these redundant bits after the source data. The source data and the ECC data are stored together in the flash memory. To balance die size cost and manufacturing yield, the ECC circuit has its correction capability limitation. Typically, the ECC circuit can fix 4 or 8 bits errors per 512 bytes data for NAND flash and 1 bit error per 8 bytes data for NOR flash, where 1 byte=8 bits. With the increasing of the capacity of the flash memory, the ECC correction capability needs to be extended.

SUMMARY

The following is a summary of a subject matter described herein in detail.

According to a first aspect of the present disclosure, a flash memory is provided. The flash memory includes: a memory cell array, a controller and a register, which is configured to store read parameters. The read parameters include a read voltage value and a read pass voltage value. The controller is configured to apply a read voltage to a word line connected to a selected page according to the read voltage value and apply a read pass voltage to adjacent word lines according to the read pass voltage value, and determine whether the selected page includes a memory cell having a first error and a memory cell having a second error.

In response to determining that the selected page includes the memory cell having the first error and the memory cell having the second error, the controller updates the read parameters by decreasing the read voltage value by a first amount and increasing the read pass voltage by a second amount.

In response to determining that the selected page includes the memory cell having the first error but does not include the memory cell having the second error, the controller updates the read parameters by decreasing the read voltage value by the first amount and maintaining the read pass voltage value.

In response to determining that the selected page includes the memory cell having the second error but does not include the memory cell having the first error, the controller updates the read parameters by maintaining the read voltage value and increasing the read pass voltage value by the second amount.

In response to determining that the selected page does not include the memory cell having the first error and the memory cell having the second error, the controller maintains the read parameters in the register.

According to a second aspect of the present disclosure, a method for operating a flash memory is provided. The method includes: obtaining read parameters from a register of the flash memory, where the read parameters include a read voltage value and a read pass voltage value; applying a read voltage to a word line connected to a selected page and applying a read pass voltage to adjacent word lines according to the read parameters, and obtaining raw data stored in the selected page; determining whether the selected page includes a memory cell having a first error and a memory cell having a second error; and updating the read parameters stored in the register in response to determining that the selected page comprises either or both of the memory cell having the first error and the memory cell having the second error.

According to a third aspect of the present disclosure, a method for operating a flash memory is provided. The method includes: obtaining read parameters from a register of the flash memory, where the read parameters comprise a read voltage value and a read pass voltage value; applying a read voltage to a word line connected to a selected page and applying a read pass voltage to adjacent word lines according to the read parameters, and obtaining raw data stored in the selected page; determining whether the selected page includes a memory cell having a first error; and in response to determining that the selected page includes the memory cell having the first error, decreasing the read voltage value stored in the register by a first amount, and in response to determining that the selected page does not include the memory cell having the first error, maintaining the read voltage value stored in the register.

According to embodiments of the present disclosure, the error bit in data stored in the flash memory may be sensed correctly in the next read operation by tuning at least one of the read voltage and the read pass voltage, and thus the ECC correction capability is extended without increasing ECC's bits.

BRIEF DESCRIPTION OF DRAWINGS

The accompanying drawings are used for providing further understanding of the present disclosure and constitute a part of this specification. Elements and/or components in the figures are not necessarily drawn to scale.

DETAILED DESCRIPTION

Example embodiments of the present disclosure will be more clearly understood from the detailed description taken in conjunction with the accompanying drawings. Various example embodiments of the present disclosure will now be described more fully with reference to the accompanying drawings in which some example embodiments of the disclosure are shown. In the drawings, the sizes or configurations of elements may be idealized or exaggerated for clarity.

Detailed illustrative embodiments of the present disclosure are disclosed herein. However, specific structural and functional details disclosed herein are merely representative for purposes of describing example embodiments of the present disclosure. This disclosure, however, may be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. As used herein, the term "and/or" includes any and all combinations of one or more of the associated listed items.

It will be understood that when an element is referred to as being "connected" to another element, it can be directly connected to the element or an intervening element may be present. In contrast, when an element is referred to as being "directly connected" to another element, there are no intervening element present.

The terminology used herein is for the purpose of describing particular embodiments only and is not intended to be limiting of example embodiments of the disclosure. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Various embodiments of the present disclosure provide a flash memory. The flash memory may be a NAND flash. The NAND flash may be a single-level cell (SLC) NAND flash, which just stores one binary bit per memory cell, a multi-level cell (MLC) NAND flash, a trinary-level cell (TLC) NAND flash, or a quad-level cells (QLC) NAND flash. The NAND flash may be 2D NAND flash or 3D NAND flash. In the 3D NAND flash, the memory cells are stacked vertically in multiple layers.

Figure 1:
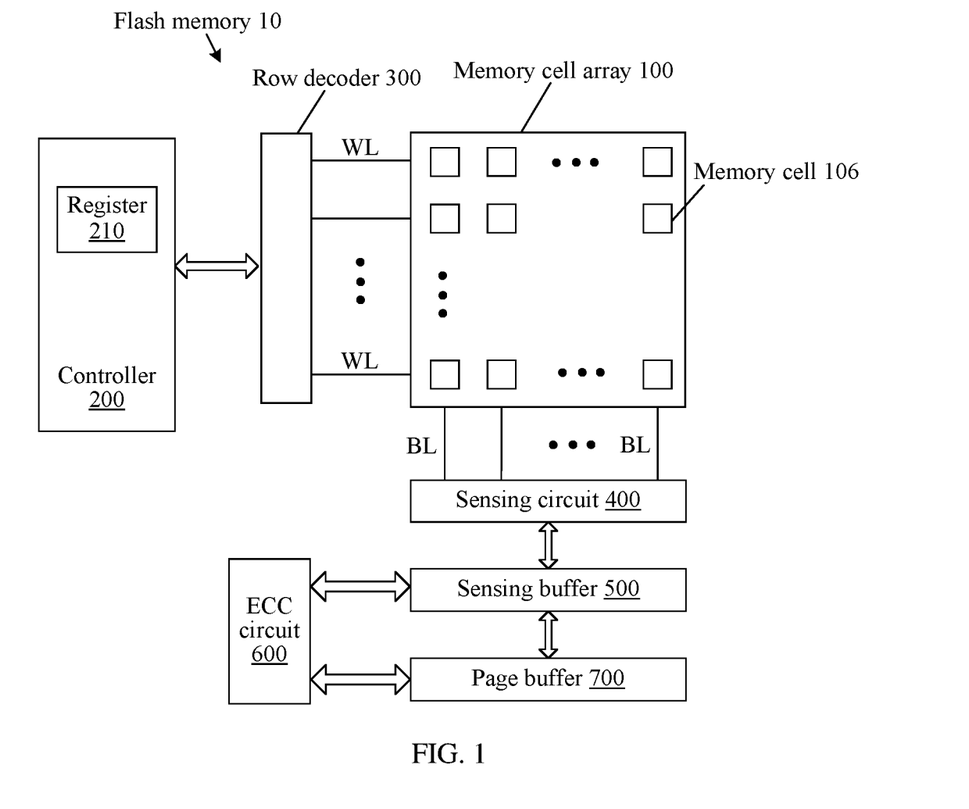
FIG. 1 is a simplified block diagram of a flash memory according to an embodiment of the present disclosure.

FIG. 1 is a simplified block diagram of a flash memory according to an embodiment of the present disclosure. As shown in FIG. 1, the flash memory 10 includes: a memory cell array 100, a controller 200, a row decoder 300, a sensing circuit 400, a sensing buffer 500, an ECC circuit 600, and a page buffer 700. The memory cell array 100 includes a plurality of memory cells 106 which are addressed by bit lines BL and word lines WL. Each memory cell 106 corresponds to one bit in SLC, or two bits in MLC, or three bits in TLC, or four bits in QLC.

The controller 200 is connected to the row decoder 300, the sensing circuit 400, and the sensing buffer 500, the ECC circuit 600, and the page buffer 700. The controller 200 is further connected to a host (not shown) such as a personal computer, a digital camera, personal digital assistant, etc. The controller 200 is configured to accept target data to be wrote into the memory cell array 100 from the host, and also configured to output data retrieved from the memory cell array 100 to the host.

The row decoder 300 is connected to the word lines WL. The sensing circuit 400 is connected to the bit lines BL. The row decoder 300 may be utilized in conjunction with a voltage generation circuit. The voltage generation circuit may be implemented by a charge pump, and is configured to generate a program voltage, a read voltage, a verification voltage, a read pass voltage, a program pass voltage. The row decoder 300 decodes an address signal received from the controller 200 to select one or more word lines WL, such that one or more of the above voltages are applied to the selected word lines WL. The flash memory 10 further includes a register 210. The register 210 stores operating parameters such as the program voltage value, the read voltage value, the erase voltage value and the like. For example, the magnitude of the read voltage generated by the voltage generation circuit is determined by the read voltage value. Optionally, the register 210 is integrated within the controller 210 as shown in FIG. 1.

The flash memory 10 shown in FIG. 1 may further include a column decoder (not shown). The column decoder may be utilized in conjunction with another voltage generation circuit. The column decoder selects one or more bit lines BL according to an address signal received from the controller 200, and the selected bit lines receive corresponding voltages, such as a program inhibit voltage.

Figure 2:
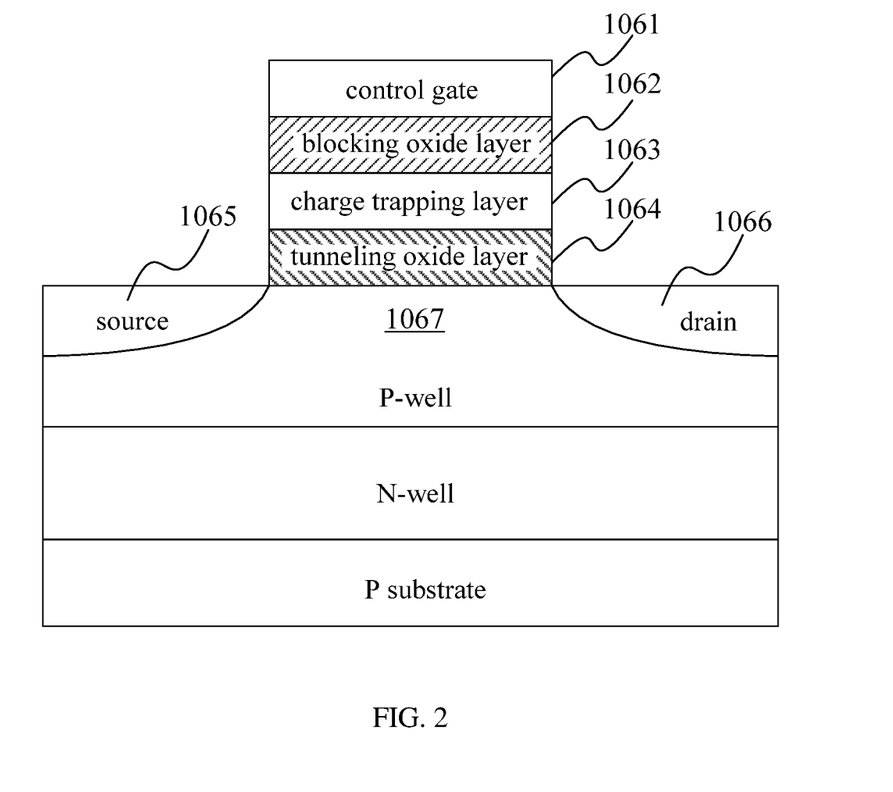
FIG. 2 is a schematic diagram of a memory cell in the flash memory.

The memory cell 106 may be implemented by a field-effect transistor. FIG. 2 is a schematic block diagram of the field-effect transistor placed in a triple-well structure. As shown in FIG. 2, the field-effect transistor includes a control gate 1061, a charge trapping layer 1063, a tunneling oxide layer 1064, a blocking oxide layer 1062, a source 1065, a drain 1066 and a channel region 1067. The tunneling oxide layer 1064 is interposed between the charge trapping layer 1063 and the channel region 1067. The blocking oxide layer 1062 is interposed between the control gate 1061 and the charge trapping layer 1063. The charge trapping layer may be a floating gate made of polysilicon or a dielectric layer typically made of silicon nitride. The control gate 1061 is electrically connected to a corresponding word line WL. The drain 1066 is connected to a corresponding bit line BL.

Figure 3:
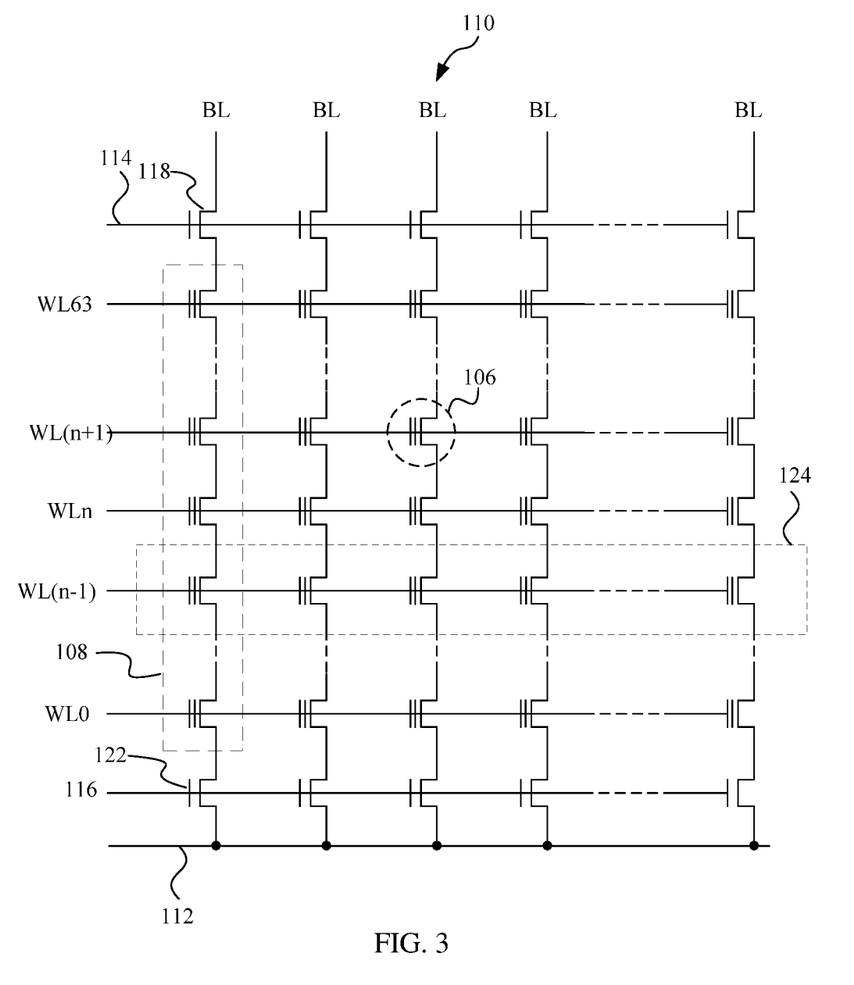
FIG. 3 is a schematic diagram of an exemplary configuration of a memory cell block of a NAND flash memory according to an embodiment of the present disclosure.

In a typical configuration of the NAND flash memory, the memory cell array 100 includes multiple blocks, each block includes multiple pages, and each page includes multiple memory cells 106. FIG. 3 shows an exemplary configuration of the memory cell block 110 in the NAND flash memory. For example, the NAND flash memory shown in FIG. 3 is 2 GB and includes 2048 blocks 110 each including 64 pages 124. As shown in FIG. 3, the memory cells 106 in the block 110 are arranged in rows and columns, and memory cells 106 in the column direction are connected in series to constitute a memory cell string 108. Specifically, the memory cells 106 in a same memory cell string 108 are daisy-chained by their sources and drains. Each memory cell string 108 is connected to a respective one of the bit lines BL via a first select switch 118. Data stored in the memory cell 106 can be sensed via the bit line BL by the sensing circuit 400. The first select switch 118 is controlled by a first control signal line 114. Each memory cell string 108 is further connected to a common source line 112 via a second select switch 122. The second select switch 122 is controlled by a second control signal line 116. The memory cells 106 in the row direction share a same word line WL, and constitute one page 124. In other words, control gates of the memory cells 106 in a same page 124 are all connected to a same word line WL.

Figure 4:
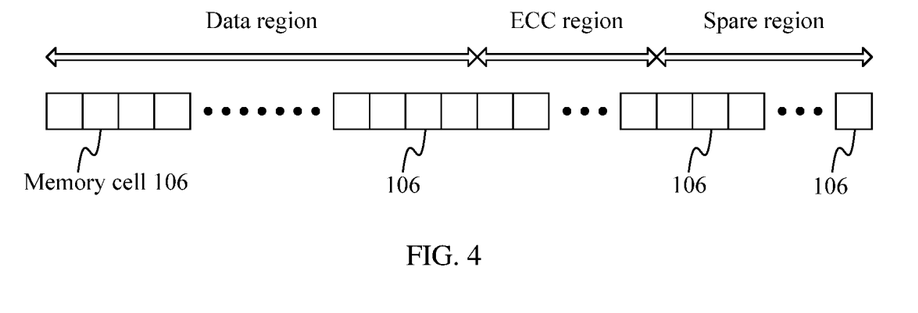
FIG. 4 is a schematic diagram of an exemplary configuration of a memory cell page of a NAND flash memory according to an embodiment of the present disclosure.

FIG. 4 shows an exemplary configuration of a page 124 of the NAND flash memory. Each block in FIG. 4 denotes a corresponding memory cell 106 in the page. The page 124 includes a data region (also referred to as main region), an error correction code (ECC) region and a spare region. The spare region contains memory is used for storing firmware meta data (e.g., P/E count, address mapping). The data region is used for storing user data. Each memory cell in the data region represents a bit of the stored data. The ECC region is used for storing ECC data generated by the ECC circuit 600.

ECC is used for correcting a limited number of bit errors within the user data stored in the data region. The most common ECC schemes for the NAND flash memory include BCH code, RS code, Hamming code, and the like. The ECC circuit 600 corrects the data read out from the data region using the ECC data and stores the corrected data in the page buffer 700. In an exemplary embodiment, the ECC circuit 600 may be integrated in the controller 200. The controller 200 may be a microprocessor, a micro controller unit (MCU), or an application specific integrated circuit (ASIC). The sensing buffer 500 and the page buffer 700 may be implemented by static random access memories (SRAMs).

Operations of the flash memory typically include program (write), erase and read. Briefly, the program operation is an action of adding electrons into the charge trapping layer, whereas the erase operation is an action of moving the electrons from the charge trapping layer to the channel region. In the program operation, a program voltage is applied to the control gate 1061 of the memory cell 106 via the word line WL, and a voltage much less than the program voltage is applied to the drain 1066 via the bit line BL, such that electrons in the channel region 1067 move into the charge trapping layer 1063 and are trapped in the charge trapping layer 1063. For the NAND flash, an exemplary program voltage is 17~20V, the drain is grounded, and the electrons move into the charge trapping layer 1063 through a FN tunneling mechanism. In the erase operation of the NAND flash, an erase voltage (e.g., 20V) is applied to the p-well and a voltage about 0V is applied to the control gate 1061 via the word line WL, such that electrons trapped in the charge trapping layer 1063 move back to the channel region 1067. Typically, the memory cell 106 has a greater threshold voltage in the programmed state than in the erased state.

The program operation and the erase operation may be followed by a verification operation and a bit scan operation. The verification operation and the bit scan operation are used for determining whether the memory cells reach their target states.

The read operation is to address the target memory cell 106 within the memory cell array 100 and measure the information stored therein (that is, sense the state of the memory cell). In the read operation, a read voltage, which is greater than the threshold voltage in the erased state and less than the threshold voltage in the programmed state, is applied to the control gate of the target memory cell 106 via the word line WL. For SLC NAND flash, if the target memory cell is in the programmed state, the target memory cell is in the off state and non-conducting, and the target memory cell is considered as storing information "0"; if the target memory cell is in the erased state, the target memory cell is in the on state and conducting, and the target memory cell is considered as storing information "1". Typically, the read operation is performed in page for the NAND flash memory and uses the read parameters stored in the register 210. The register 210 may be a volatile memory. In an exemplary embodiment, each time the flash memory 10 is powered on, the controller 200 accesses a ROM or an area of the memory cell array where default parameter values are stored, and loads the default parameter values in the register 210.

In some circumstances, the data stored in the memory cell page by the program operation is not exactly identical to the target data and contains error bits. The error bits include two types. A first type is that a memory cell having a target value "0", but a value"1" is read out form the memory cell in the read operation. A second type is that a memory cell having a target value "1", but a value "0" is read out from the memory cell in the read operation. The first type of error bit may be caused by the following reasons: this memory cell was not successfully programmed or data loss effect occurs at this memory cell. The second type of bit error may be caused by the following reasons: this memory cell was not successfully erased or coupling occurs at this memory cell. Data retention is a concept for characterizing the flash memory cell's ability of keeping the stored information with no biases applied, i.e. keeping the electrons trapped into the charge trapping layer 1063. However, even with no bias applied, electron after electron, charge loss of the charge trapping layer 1063 can lead to a read failure: a programmed cell can be read as erased if its threshold voltage drops too much. Such charge loss causes the stored information to change from "0" to "1". The threshold voltage of the memory cell may be unintentionally increased by a program operation performed on an adjacent memory cell, which is referred to as coupling effect or disturb effect. If the threshold voltage of the memory cell in the eased state is increased too much, the information stored in this memory cell may be changed from "1" to "0". Herein, the first type of error bit is referred to as a data loss error, and the second type of error bit is referred to as a coupling error. Accordingly, the memory cell which was not programmed correctly and the memory cell affected by the data loss effect are referred to as the memory cell having the data loss error (first error), and the memory cell affected by the coupling effect and the memory cell which was not erased correctly are referred to as the memory cell having the coupling error (second error). The error bits can be fixed by the ECC circuit 600, but the correction capability of the ECC circuit is limited.

In one or more embodiments of the present disclosure, the flash memory 10 performs read operation using the read parameters stored in the register 210. The read parameters may include a read voltage value for the selected word line WLn, a read pass voltage value for the adjacent word lines WL(n+1) and WL(n−1), a read pass voltage value for other word lines. In an exemplary embodiment, the register 210 may store multiple sets of read parameters, and each set corresponds to a respective block 110. The read parameters stored in the register 210 may be updated after the read operation. An exemplary updating method is as follows. After a read operation in which raw data stored in the selected page is read out, it is determined whether the raw data has an error bit. If the raw data has one or more error bits, the read parameters are updated. If the raw data has no error bit, the read parameters are kept unchanged. If the raw data only has the first type of error bit, the read parameters are updated by decreasing the read voltage value and maintaining the read pass voltage value for the adjacent word lines WL(n+1) and WL(n−1). If the raw data only has the second type of error bit, the read parameters are updated by maintaining the read voltage value and increasing the read pass voltage value for the adjacent word lines WL(n+1) and WL(n−1). If the raw data not only has the first type of error bit but also has the second type of error, the read parameters are updated by decreasing the read voltage value and increasing the read pass voltage value for the adjacent word lines WL(n+1) and WL(n−1).

In an exemplary embodiment, every time the flash memory 10 is powered on, the controller 200 accesses an area of the memory cell array 100 where the default read parameters are stored, and loads the default read parameters into the register 210. The default read voltage value may be 0~0.7V, the default read pass voltage value for the adjacent word lines and the default read pass voltage value for other word lines may be 7V. The read parameters in the register 210 may be updated multiple times. In an exemplary embodiment, each block has its dedicated read parameters, and the read parameters are updated after each read operation in which the raw data has one or more bit errors.

Figure 5:
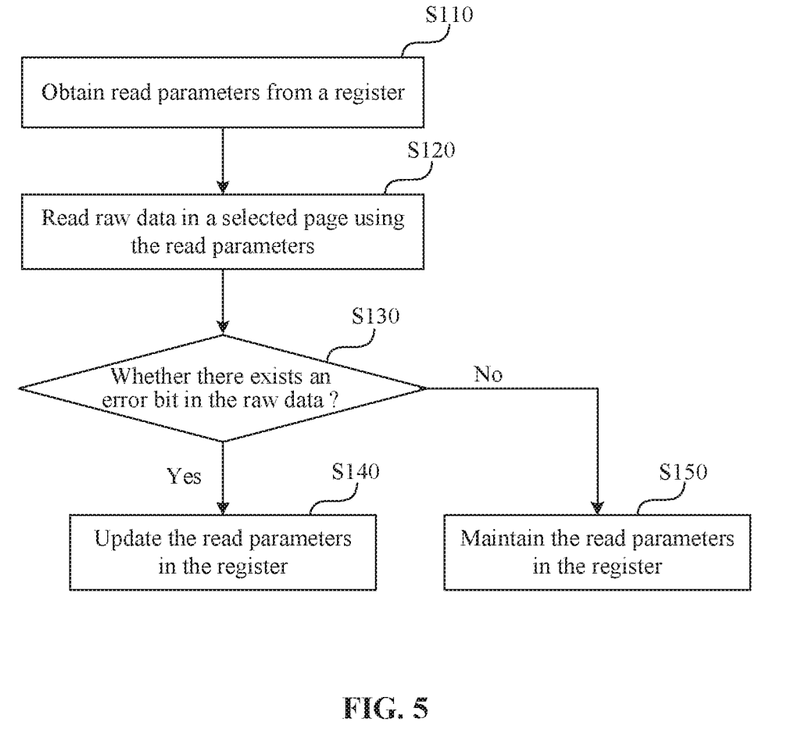
FIG. 5 is a flowchart of a method for operating the flash memory according to an embodiment of the present disclosure.

One or more embodiments of the present disclosure provides a method for operating the NAND flash memory. The read method starts when the controller 200 receives an instruction from the host. The controller 200 selects a page according to the instruction. FIG. 5 is a flowchart of the method for operating the flash memory. As shown in FIG. 5, the method includes the following steps.

In step S110, the controller 200 obtains current read parameters from the register 210.

The read parameters includes the read voltage value for the word line WLn of the selected page, the read pass voltage value for adjacent word lines WL(n+1) and WL(n−1), and the read pass voltage value for other word lines.

In step S120, raw data in the selected page is read out using the read parameters. Specifically, the voltage generation circuit generates the read voltage $V_{read}$ according to the read voltage value, generates the read pass voltage $V_{pass1}$ according to the read pass voltage value for adjacent word lines WL(n+1) and WL(n−1), and generates the read pass voltage $V_{pass2}$ according to the read pass voltage value for other word lines. The read voltage $V_{read}$ is applied to the word line WLn, the read pass voltage $V_{pass1}$ is applied to the adjacent word lines WL(n+1) and WL(n−1), and the read pass voltage $V_{pass2}$ is applied to other word lines in this block. The sensing circuit 400 reads out the raw data and stores the raw data in the sensing buffer 500.

Figure 7:
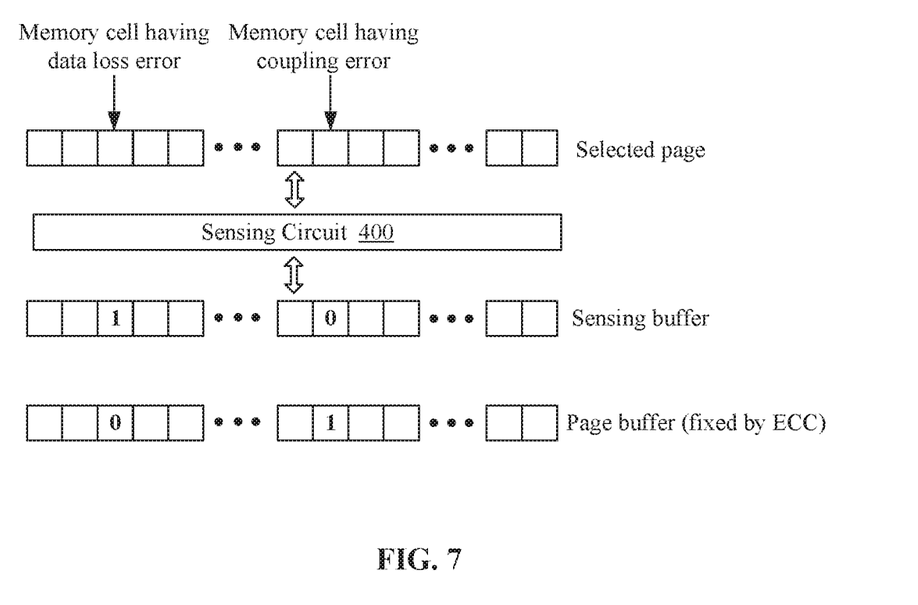
FIG. 7 is a schematic diagram of locating the memory cell having the data loss error and the memory cell having the coupling error.

In step S130, it is determined whether raw data has an error bit, that is, it is determined whether the selected page includes a memory cell in an error state. The raw data is corrected by the ECC circuit 600 and the corrected data is stored in the page buffer 700. The controller 200 or the ECC circuit 600 determines whether the raw data has error bit by comparing the raw data and the corrected data FIG. 7 shows how to determine whether the raw data has the error bit and locate the memory cell in the error state. As shown in FIG. 7, the bit in the raw data corresponding to the memory cell having the data loss error is 1, and the bit in the corrected data corresponding to the memory cell having the data loss error is 0. The bit in the raw data corresponding to the memory cell having the coupling error is 0, and the bit in the corrected data corresponding to the memory cell having the coupling error is 1.

If the raw data has no error bit, the method proceeds to step S150, in which the read parameters in the register are kept unchanged.

If the raw data has the error bit, the method proceeds to step S140, in which the read parameters in the register are updated. The updated read parameters in the register will be used in the next read operation. In response to determining that the raw data not only includes the first type of error bit (data loss error bit) but also includes the second type of error bit (data coupling error bit), the read voltage value is decreased by a first amount, the read pass voltage value for the adjacent word lines WL(n+1) and WL(n−1) is increased by a second amount. The first amount and the second amount are adjustable. For example, the first amount may be 0.1V~0.3V, and the second amount may be 0.1V~0.3V. In response to determining that the raw data only includes the first type of error bit, the read voltage value is decreased by the first amount and the read pass voltage value for the adjacent word lines WL(n+1) and WL(n−1) is kept unchanged. If the raw data only includes the second type of error bit, the read voltage value is kept unchanged and the read pass voltage value for the adjacent word lines WL(n+1) and WL(n−1) is increased by the second amount. It should be noted that the read pass voltage value for other word lines is kept unchanged on matter whether the raw data has the error bit.

Optionally, the operation method further includes the following steps. The controller 200 determines whether the decreased read voltage value is less than a first predetermined value, and replaces the decreased read voltage value with the first predetermined value in response to determining that the decreased read voltage value is less than the first predetermined value. The controller 200 determines whether the increased read pass voltage value is greater than a second predetermined value, and replaces the increased read pass voltage value with the second predetermined value in response to determining that the increased read pass voltage value is greater than the second predetermined value.

Figure 6:
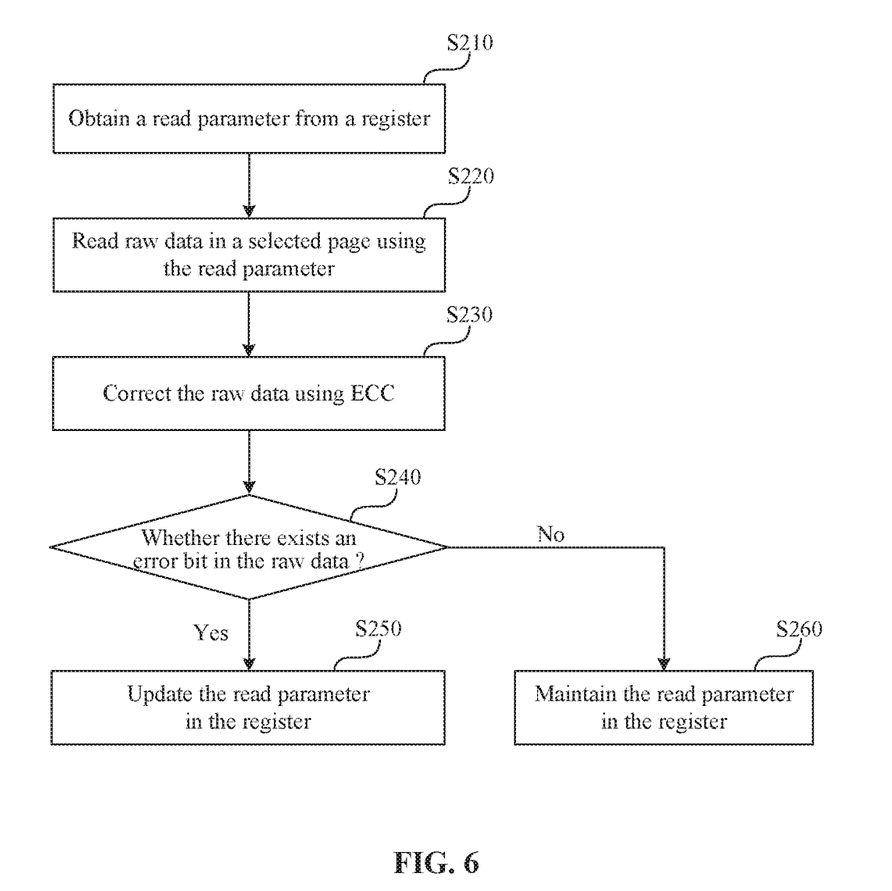
FIG. 6 is a flowchart of another method for operating the flash memory according to an embodiment of the present disclosure.

Embodiments of the present disclosure further provide another method for operating the flash memory. As shown in FIG. 6, the method includes steps S210 to S260.

In the step S210, the controller 200 obtains the read parameters from the register 210.

In step S220, the sensing circuit 400 reads out the raw data and stores the raw data in the sensing buffer 500. Specifically, the voltage generation circuit generates the read voltage and the read pass voltage according to the read parameters. The read voltage is applied to the word line WLn and the read pass voltage is applied to other word lines in this block.

In step S230, the ECC circuit 600 corrects the raw data using the ECC data.

In step S240, the ECC circuit 600 or the controller 200 determines whether the selected page includes the memory cell having the data loss error.

If the selected page does not include the memory cell having the data loss error, the method proceeds to step S260. In step S260, the read parameters are kept unchanged, that is, the next read operation will use the same read parameters. The corrected data is outputted to the controller 200, and the method ends.

If the selected page includes the memory cell having the data loss error, the method proceeds to step S250. In step S250, the read voltage value in the read parameters is decreased by the first amount, and the next read operation will use the updated read parameters. The method show in FIG. 6 may be used in both the NAND flash and the NOR flash. The method shown in FIG. 6 may be used in the SLC flash, the MLC flash, the TLC flash or the QLC flash.

In one or more embodiments, the method shown in FIG. 6 further includes the following steps. The ECC circuit 600 or the controller 200 determines whether the selected page includes the memory cell having the coupling error. If the selected page includes the memory cell having the coupling error, the read pass voltage value for adjacent word lines WL(n+1) and WL(n−1) in the read parameters is increased by the second amount. If the selected page does not include the memory cell having the coupling error, the read pass voltage adjacent word lines WL(n+1) and WL(n−1) in the read parameters is kept unchanged.

According to various embodiments of the present disclosure, the read parameters are tuned according to the data stored in the memory cell array, the error bit may be sensed correctly in the next read operation, and thus the ECC correction capability is extended without increasing ECC's bits.

An embodiment of the present disclosure further provides a data storage product. The data storage product includes a processor, a power source, and the flash memory in the above embodiments.

In various embodiments, the nonvolatile memory is at least one of a multimedia card (MMC) card, a Secure Digital (SD) card, a micro SD card, a memory stick, an ID card, a PCMCIA card, a chip card, a USB card, a smart card, and a Compact Flash (CF) card.

The nonvolatile memory may be packaged by a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While exemplary embodiments are described above, it is not intended that these embodiments describe all possible forms encompassed by the claims. The words used in the specification are words of description rather than limitation, and it is understood that various changes may be made without departing from the spirit and scope of the disclosure and claims. As previously described, the features of various embodiments may be combined to form further embodiments of the disclosure that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to: cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A flash memory, comprising:
   a memory cell array;
   a controller; and
   a register, configured to store a read voltage value and a read pass voltage value for operating the memory cell array,
   wherein the controller is configured to:
   apply a read voltage to a word line connected to a selected page of the memory cell array according to the read voltage value and apply a read pass voltage to adjacent word lines according to the read pass voltage value;
   determine whether the selected page comprises a memory cell having a first error and a memory cell having a second error;
   in response to determining that the selected page comprises the memory cell having the first error and the memory cell having the second error, decrease the read voltage value by a first amount and increase the read pass voltage value by a second amount;
   in response to determining that the selected page comprises the memory cell having the first error but does not comprise the memory cell having the second error, decrease the read voltage value by the first amount and maintain the read pass voltage value;
   in response to determining that the selected page comprises the memory cell having the second error but does not comprise the memory cell having the first error, maintain the read voltage value and increase the read pass voltage value by the second amount; and
   in response to determining that the selected page does not comprise the memory cell having the first error and the memory cell having the second error, maintain both of the read voltage value and the read pass voltage value.

2. The flash memory according to claim 1, further comprising: a sensing circuit, a first buffer, and a second buffer, wherein when the controller applies the read voltage to the word line connected to the selected page and applies the read pass voltage to adjacent word lines according to the read pass voltage value, the sensing circuit reads raw data from the selected page and stores the raw data into the first buffer, and wherein the second buffer is configured to store corrected data obtained by correcting the raw data using an error correcting code.

3. The flash memory according to claim 2, wherein the controller determines whether the selected page comprises the memory cell having the first error and the memory cell having the second error by comparing the raw data stored in the first buffer and the corrected data in the second buffer.

4. The flash memory according to claim 3, wherein a bit in the raw data corresponding to the memory cell having the first error is 1 and a bit in the corrected data in the memory cell having the first error is 0; a bit in the raw data corresponding to the memory cell having the second error is 0 and a bit in the corrected data in the memory cell having the second error is 1.

5. The flash memory according to claim 1, wherein the first amount is 0.1V~0.3V and the second amount is 0.1V~0.3V.

6. The flash memory according to claim 1, wherein the memory cell array has an area for storing a default value of the read voltage value and a default value of the read pass voltage value.

7. A method for operating a flash memory, comprising the following steps:
obtaining read parameters from a register of the flash memory, wherein the read parameters are used for operating a memory cell array and comprise a read voltage value and a read pass voltage value;
applying a read voltage to a word line connected to a selected page of the memory cell array and applying a read pass voltage to adjacent word lines according to the read parameters, and reading raw data from the selected page;
determining whether the selected page comprises a memory cell having a first error and a memory cell having a second error; and
updating the read parameters stored in the register in response to determining that the selected page comprises at least one of the memory cell having the first error or the memory cell having the second error,
wherein the step of determining whether the selected page comprises a memory cell having a first error and a memory cell having a second error comprises:
correcting the raw data using an error correcting code; and
comparing the raw data and the corrected data, wherein a bit in the raw data corresponding to the memory cell having the first error is 1 and a bit in the corrected data in the memory cell having the first error is 0; a bit in the raw data corresponding to the memory cell having the second error is 0 and a bit in the corrected data in the memory cell having the second error is 1.

8. The method according to claim 7, wherein the step of updating the read parameters stored in the register comprises:
in response to determining that the selected page comprises the memory cell having the first error and the memory cell having the second error, decreasing the read voltage value by a first amount and increasing the read pass voltage value by a second amount;
in response to determining that the selected page comprises the memory cell having the first error but does not comprise the memory cell having the second error, decreasing the read voltage value by the first amount and maintaining the read pass voltage value;
in response to determining that the selected page comprises the memory cell having the second error but does not comprise the memory cell having the first error, maintaining the read voltage value and increasing the read pass voltage value by the second amount; and
in response to determining that the selected page does not comprise the memory cell having the first error and the memory cell having the second error, maintaining both of the read voltage value and the read pass voltage value.

9. The method according to claim 8, wherein the first amount is 0.1V~0.3V and the second amount is 0.1V~0.3V.

10. The method according to claim 7, wherein the updated parameters are used in a next read operation.

11. A method for operating a flash memory, comprising the following steps:
obtaining read parameters from a register of the flash memory, wherein the read parameters are used for operating a memory cell array and comprise a read voltage value and a read pass voltage value;
applying a read voltage to a word line connected to a selected page of the memory cell array and applying a read pass voltage to adjacent word lines according to the read parameters, and reading raw data from the selected page;
determining whether the selected page comprises a memory cell having a first error; and
in response to determining that the selected page comprises the memory cell having the first error, decreasing the read voltage value stored in the register by a first amount, and in response to determining that the selected page does not comprise the memory cell having the first error, maintaining the read voltage value stored in the register,
wherein the step of determining whether the selected page comprises a memory cell having a first error comprises:
correcting the raw data using an error correcting code; and
comparing the raw data and the corrected data, wherein a bit in the raw data corresponding to the memory cell having the first error is 1 and a bit in the corrected data in the memory cell having the first error is 0.

12. The method according to claim 11, further comprising:
determining whether the decreased read voltage value is less than a predetermined value; and
replacing the decreased read voltage value with the predetermined value in response to determining that the decreased read voltage value is less than the predetermined value.

13. The method according to claim 11, further comprising:
determining whether the selected page comprises a memory cell having a second error; and
in response to determining that the selected page comprises the memory cell having the second error, increasing the read pass voltage value stored in the register by a second amount; and in response to determining that the selected page does not comprise the memory cell having the second error, maintaining the read pass voltage value stored in the register.

14. The method according to claim 13, wherein the step of determining whether the selected page comprises a memory cell having a second error comprises:

correcting the raw data using the error correcting code; and comparing the raw data and the corrected data, wherein a bit in the raw data corresponding to the memory cell having the second error is 0 and a bit in the corrected data in the memory cell having the second error is 1.

15. The method according to claim 13, wherein the first amount is 0.1V~0.3V and the second amount is 0.1V~0.3V.

16. The method according to claim 13, further comprising:

determining whether the increased read pass voltage value is greater than a predetermined value; and replacing the increased read pass voltage value with the predetermined value in response to determining that the increased read pass voltage value is greater than the predetermined value.

* * * * *